(12) United States Patent
Miller et al.

(10) Patent No.: US 7,781,957 B2
(45) Date of Patent: Aug. 24, 2010

(54) ELECTRO-LUMINESCENT DEVICE WITH IMPROVED EFFICIENCY

(75) Inventors: Michael E. Miller, Honeoye Falls, NY (US); Paul J. Kane, Rochester, NY (US); Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 544 days.

(21) Appl. No.: 11/680,195

(22) Filed: Feb. 28, 2007

(65) Prior Publication Data

US 2008/0203895 A1 Aug. 28, 2008

(51) Int. Cl.
*H01J 1/62* (2006.01)
(52) U.S. Cl. .................. 313/500; 313/502; 313/503; 313/506
(58) Field of Classification Search .......... 313/498–512
See application file for complete search history.

(56) References Cited

U.S. PATENT DOCUMENTS

| | | | |
|---|---|---|---|
| 6,864,626 | B1 | 3/2005 | Weiss et al. |
| 7,012,588 | B2 | 3/2006 | Siwinski |
| 2005/0077817 | A1* | 4/2005 | Yamazaki et al. ........... 313/504 |
| 2005/0212728 | A1 | 9/2005 | Miller et al. |
| 2005/0225232 | A1* | 10/2005 | Boroson et al. ............ 313/504 |
| 2006/0105198 | A1 | 5/2006 | Spindler et al. |
| 2006/0169971 | A1* | 8/2006 | Cho et al. ..................... 257/14 |

FOREIGN PATENT DOCUMENTS

WO 00/11728 3/2000

OTHER PUBLICATIONS

"Quantum Dot Light Emitting Devices for Pixelated Full Color Displays", by Bulovic and Bawendi, 2006, Society for Information Display Conference, ISBN: 0006-0966X/06/3702.
"Suggested Optimum Primaries and Gamut in Color Imaging", by Thornton, Color Research and Application, vol. 25, #4, 2000, John Wiley & Sons, Inc.
Seth Coe-Sullivan, "Tuning the performance of hybrid organic/inorganic quantum dot light-emitting devices", Organic Electronics, Sep. 1, 2003, pp. 123-130.
Hsueh Shih Chen, et al., "White-light emission from organics-capped ZnSe quantum dots and application in white-light-emitting diodes", Applied Physics Letters, vol. 86, No. 13.
Yanqin Li, et al., "Bright White-Light-Emitting Device from Ternary Nanocrystal Composites", Advanced Materials, vol. 18, No. 19, Sep. 26, 2006, pp. 2545-2548.

* cited by examiner

*Primary Examiner*—Bumsuk Won
(74) *Attorney, Agent, or Firm*—Stephen H. Shaw; Raymond L. Owens

(57) ABSTRACT

An electro-luminescent device has an array of light-emitting elements, including a near white light-emitting element. The near white light-emitting element includes an inorganic light-emitting layer of quantum dots, spaced between a pair of electrodes. The light-emitting layer produces a spectrum of light having at least a bimodal distribution of wavelengths.

16 Claims, 16 Drawing Sheets

ELECTRO-LUMINESCENT DEVICE WITH IMPROVED EFFICIENCY

FIELD OF THE INVENTION

The present invention relates to inorganic LED devices employing quantum dot light-emitting layers. Specifically, the invention relates to inorganic LED devices employing quantum dot white light-emitting elements.

BACKGROUND OF THE INVENTION

In recent years, light-emitting devices have included quantum-dot emitting layers to form large area light emission. One of the predominant attributes of this technology is the ability to control the wavelength of emission, simply by controlling the size of the quantum dot. As such, this technology provides the opportunity to relatively easily design and synthesize the emissive layer in these devices to provide any desired dominant wavelength, as well as control the spectral breadth of emission peaks. This fact has been discussed in a paper by Bulovic and Bawendi, entitled "Quantum Dot Light Emitting Devices for Pixelated Full Color Displays" and published in the proceedings of the 2006 Society for Information Display Conference. As discussed in this paper, differently sized quantum dots may be formed and each differently-sized quantum dot will emit light at a different dominant wavelength. This ability to tune emission provides opportunities for creating very colorful light sources that employ single color emitters to create very narrow band and, therefore, highly saturated colors of light emission. This characteristic may be particularly desirable within the area of visual displays, which typically employ a mosaic of three different colors of light-emitting elements to provide a full-color display.

Applications do exist, however, in which it is desirable to provide less saturated light emission and/or highly efficient light emission. An application for highly efficient, broadband light emission exists in general lighting devices. Within this application area there are multiple requirements that such a light source must provide. First, the light source must provide at least one color of light that is perceived to be white. This white light requirement is typically specified in terms of color temperature or coordinates within the CIE 1931 chromaticity diagram. Secondly, the light source must be highly energy efficient. Thirdly, at least in some applications, the light source must be broadband in nature to facilitate color constancy of objects viewed under this lighting source to the same objects when viewed under natural lighting. Within this industry, it is typical to employ light-emitting materials in a single package to form a single light source. For example, typical fluorescent light bulbs employ at least a red, green, and blue phosphor to form the desired color of light emission. Further, OLED light source prototypes have been demonstrated that employ multiple dopants in a single or in multiple layers to form a white light source. However, within these systems, the spectral characteristics of light emission are highly dependent upon the molecular structure of the material that forms the light-emissive layer or the dopant that is applied, and therefore device designers must select among relatively few materials, all of which have different radiant efficiencies and spectral emission characteristics. Therefore, it is difficult to design a device that has ideal characteristics for all applications.

Within the information display application space, devices are desired to deliver a large color gamut with high efficiency. Within this application space, efficiency is typically measured in metrics such as the number of candelas that are produced as a function of input current or power. Therefore, the two requirements of large color gamut and high efficiency are often in conflict with one another. This conflict occurs due to the fact that as the color gamut of the display is expanded, the red and blue emitters must often be shifted towards very short and very long wavelengths, respectively, and the human eye is much less sensitive to these wavelengths than to wavelengths of light near the center of the visible spectrum. This loss of sensitivity to energy at the extremes of the visible spectrum occurs because luminous efficiency, measured in candelas, is calculated by cascading the eye sensitivity function with the radiant power spectrum of light emission. FIG. 1 shows the efficiency function of the human eye, which shows the percent efficiency of the eye to converting energy at each wavelength within the visible spectrum to an increase in perceived brightness. As this figure shows, the human eye is most sensitive to energy with a wavelength of between 550 and 560 nm 2, but much less sensitive to a very short wavelength 4 or very long wavelength 6 within the visible spectrum.

Although the loss of display efficiency that occurs as the color gamut of the display is increased can be largely explained by this discussion of the red and blue emitters, the placement of the green emissive element is also quite important. FIG. 2 shows a 1931 CIE chromaticity diagram having two triangles. The first triangle 8 depicts the color gamut of a display having a green emissive element near 533 nm. The second triangle 10 depicts a larger color gamut that may be achieved by shifting the dominant wavelength of a narrow-band green emitter to 525 nm. As is readily visible, the color gamut triangle 10 is significantly larger than the color gamut triangle 8; in fact the areas of the two triangles within this color space are 0.18 and 0.19, respectively. However, referring again to FIG. 1, it may be observed that shifting the green primary from 533 nm to 525 nm, which provides a larger color gamut, reduces the efficiency at which the human eye converts radiant power to perceived brightness from 90% to only 79%.

Numerous methods for improving the overall efficiency of a display device have been discussed in the literature. One such method is to simply select the RGB primaries to provide high efficiency while at the same time providing an "optimal gamut" as suggested by William A. Thornton in a paper entitled "Suggested Optimum Primaries and Gamut in Color Imaging" and published in Color Research and Application, vol. 25, No. 4. In this paper, the author suggests selecting the primaries of the display device to match the "prime colors" for the human visual system. As the authors suggests, this would establish a system having emitters with peak wavelengths of 450, 530, and 610 nm for the blue, green, and red emissive elements, respectively. This approach supposedly allows the display to provide maximum peak brightness for a given input energy, if it is assumed that the radiant efficiency of each of the emitters is equivalent. Unfortunately, this approach limits the color gamut of the display. In fact, the color gamut triangle 8 in FIG. 2 is obtained when the display uses light-emitting elements having these same peak wavelengths, each light-emitting element having a 30 nm bandwidth. Of further concern with this approach is that the red primary is particularly desaturated and the color of this primary may be more accurately described as orange rather than red. Therefore, while the approach described by Thorton does provide a display with good energy efficiency, it would not provide a display with a particularly good visual appearance.

A second method, which has been discussed within the organic light emitting diode art, involves the use of additional, more efficient, primaries to the typical three primary systems. For instance Burroughes in WO/0011728, entitled "Display Devices" describes an OLED system having red, green, and blue light emissive elements and at least one further light emissive element for emitting a color to which the human eye is more sensitive than the emission color of at least one of the red and blue emitters. Unfortunately, Burroughes fails to recognize that in most applications, it is particularly important to render white with high efficiency, a fact that is discussed by Miller et al in US Patent Application US 2005/212728, entitled "Color OLED Display With Improved Power Efficiency". As this application discusses the optimal power benefit when adding additional narrowband emitters to the display requires the addition of at least two additional light-emitting elements; one for emitting yellow and one for emitting cyan light. Therefore, in devices such as these, which add additional saturated color primaries, it is typically necessary to add at least two additional emitters to achieve the maximum gains in power efficiency. However, the addition of each additional primary increases the manufacturing cost of the display device since additional elements must be formed and patterned to form each colored light-emitting element, requiring more precise patterning technology to allow these additional features to be patterned within the same plane as the original three emitting elements. Image quality of the display is also often sacrificed, as there is a need for a total of 5 emissive elements per pixel, 2 of which will often be inactive at any point in time.

Another approach discussed in the organic light emitting diode literature is to add a single, highly efficient white emitting element to the display device as discussed by Siwinski in U.S. Pat. No. 7,012,588, entitled "Method For Saving Power In An Organic Electro-Luminescent Display Using White Light Emitting Elements". While disclosures, such as this one discuss the use of a white light-emitting element to improve the efficiency of the display system, they do not provide teaching as to the desired spectra of the white emitter, other than to state that it is broadband or emits a white or in-gamut color. Further, disclosures within this area which do discuss the spectral content of such a white emitter, such as US Patent Application 2006/0105198 by Spindler et al., entitled "Selecting White Point For OLED Devices" which discuss the formation of white light-emitting elements using organic materials with broad emission spectra, typically having a bandwidth of greater than 90 nm. Further, as noted earlier, the characteristics of organic white light emitting elements are limited to the characteristics that are available from organic emissive materials. The broadband response of these materials limits their maximum efficiency as energy emission occurs across a broad bandwidth range, including wavelengths to which the human eye is not particularly sensitive.

There is a need, therefore, to provide a display having a very large color gamut and high luminance efficiency, while providing no more than one additionally colored light-emitting element per pixel.

SUMMARY OF THE INVENTION

The present invention addresses the aforementioned need by providing an electro-luminescent device comprising an array of light-emitting elements, including a near white, light-emitting element. The near white light-emitting element includes an inorganic light-emitting layer of quantum dots, spaced between a pair of electrodes. The light-emitting layer produces a spectrum of light having at least a bimodal distribution of wavelengths.

DETAILED DESCRIPTION OF THE INVENTION

Figure 3:
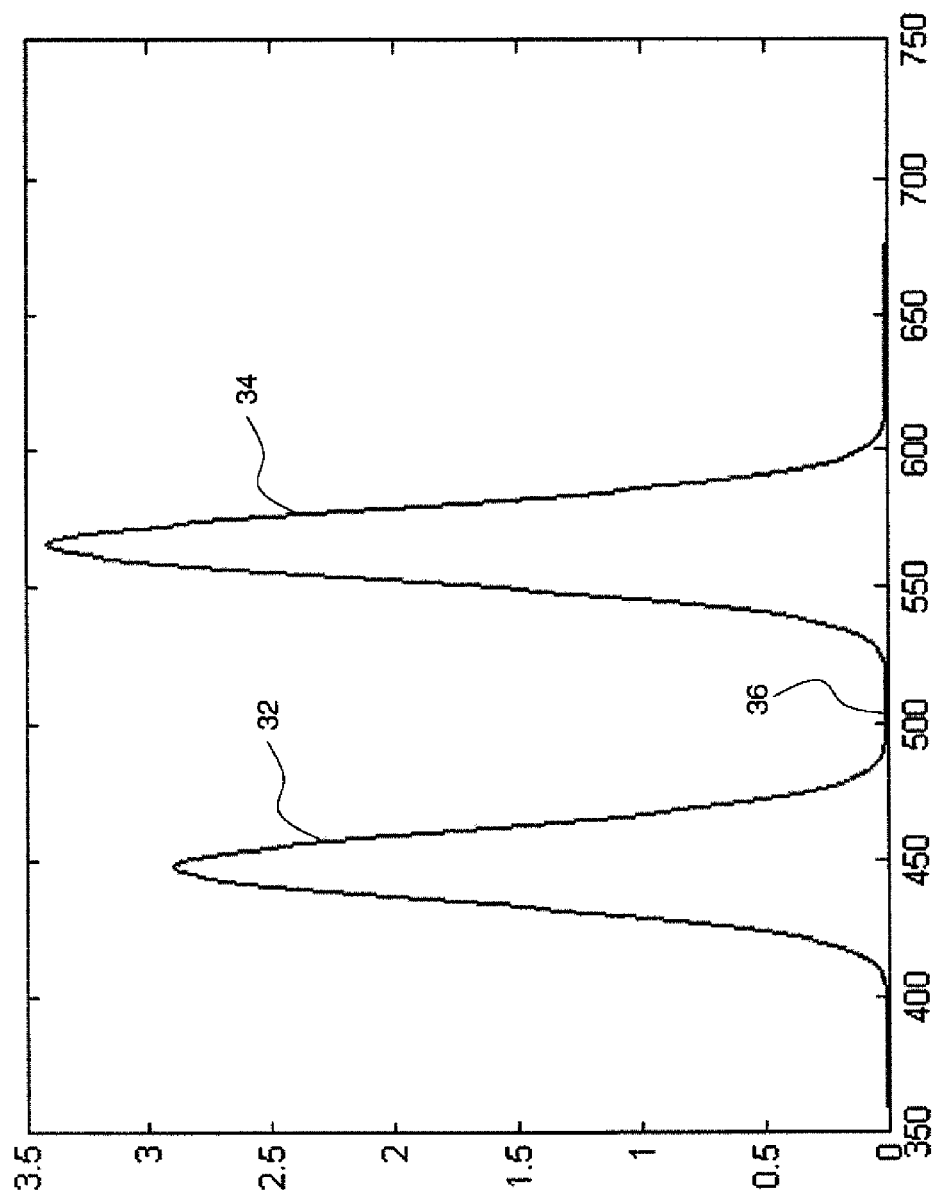
FIG. 3 illustrates a spectral power distribution for a light-emitting element according to one embodiment of the present invention.

FIG. 3 provides a plot of the radiant power as a function of wavelength for a near white light-emitting element for emitting a near white color of light according to one embodiment of the present invention. As shown in FIG. 3, the spectral distribution of light for the near white light-emitting element for emitting a near white color of light will have at least two distinct spectral peaks 32 and 34. In accord with standard mathematical terminology, a function f(x) is said to be uni-modal if for some value m, called the mode, the function f(x) is monotonically increasing for x≦m and monotonically decreasing for x≧m, in this case the maximum value of f(x) being equal to f(m). The spectral distribution shown in FIG. 3, having two such values, is said to be bi-modal. Furthermore, as applied within this disclosure, separate modes may be separated by an inter-modal minimum. Therefore, as shown in FIG. 3, the bimodal distribution will include an inter-modal minimum 36, in this instance located approximately half the distance between the two spectral peaks, and that is a mixture of light from the two populations of quantum dots in the light-emitting layer. In some embodiments, separate modes as applied within this disclosure, will be defined as having distinct spectral peaks (e.g., 32, 34) which are separated by an inter-modal minimum 36 wherein the spectral power of this inter-modal minimum should be held to less than 10% of the maximum of the distribution, and is preferably held to 5% or less than the maximum and even more preferably is held to less than 1% of the maximum.

Within this disclosure the term "near white" refers to an emitter that may appear "white", meaning that the stimulus will appear to be void of hue. Because the human visual system can adapt to a large range of colors and yet perceive them to be white, many different lights may be perceived to be void of hue, depending upon the viewing environment. The possible colors of a near white emitter will generally lie near a curve, which can be created by plotting the CIE 1931 chromaticity coordinates of blackbody radiators, but this criteria is not fully necessary. In several embodiments of the present invention, "near white" refers to colors of light that have CIE 1931 chromaticity x and y coordinates that are each between 0.2 and 0.4.

Figure 1:
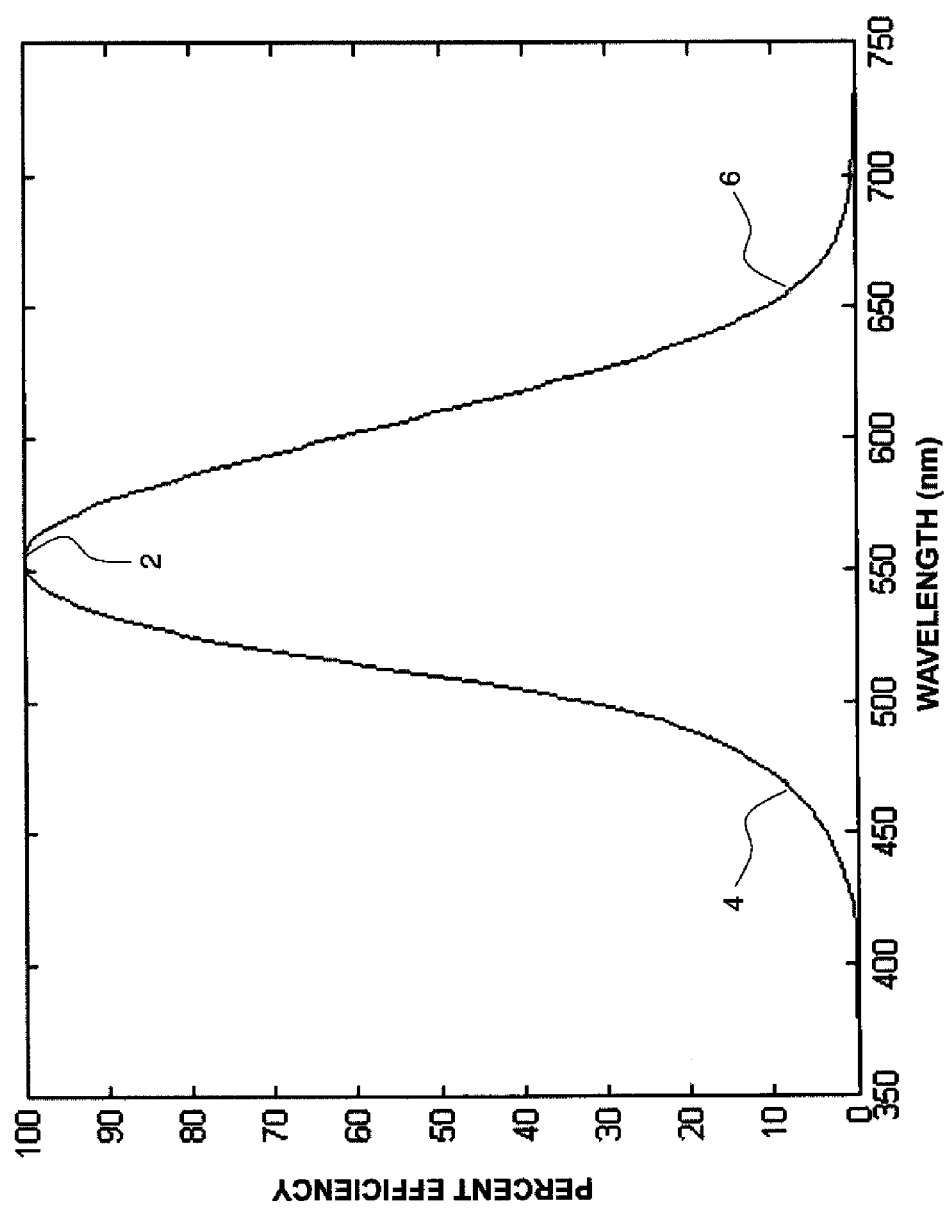
FIG. 1 illustrates a plot of the human visual sensitivity function as a function of wavelength as known in the prior art.
Figure 2:
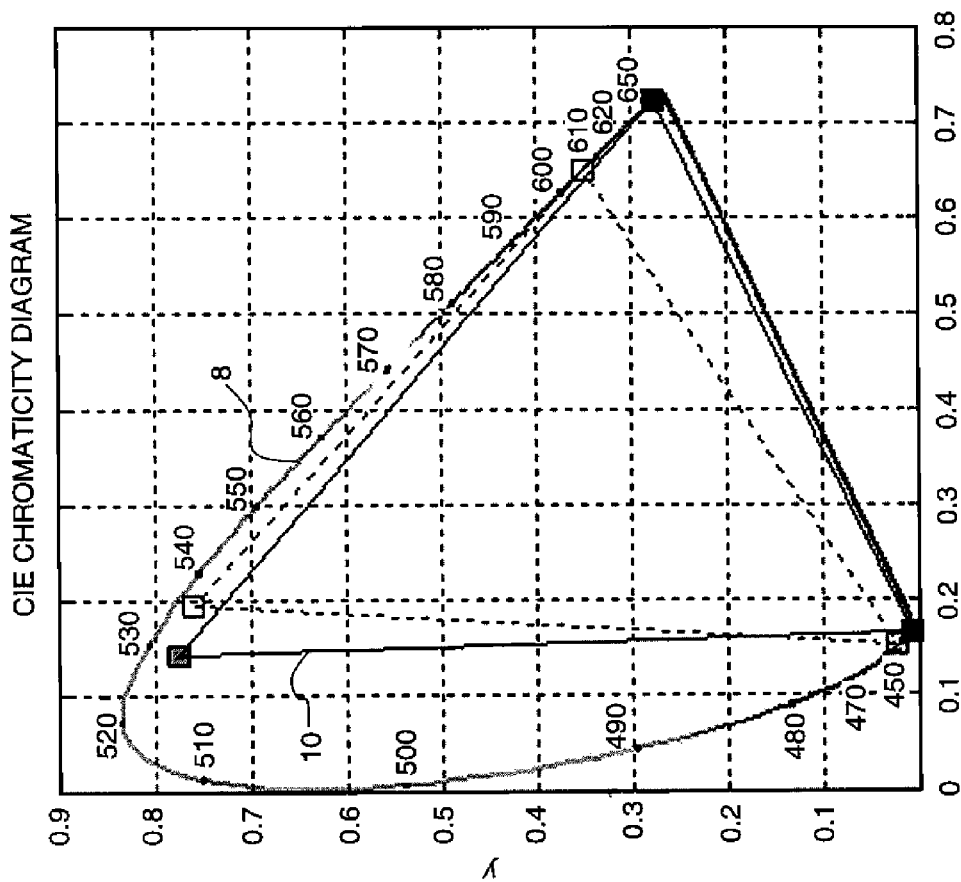
FIG. 2 illustrates a CIE x,y chromaticity diagram for two displays having different color gamuts for light-emitting elements having 30 nm wide spectral peaks as known in the prior art.

Within a device of the present invention, the bimodal distribution will preferably include a first spectral peak with an apex between 420 nm and 480 nm and a second spectral peak with an apex between 520 nm and 620 nm. Positioning these two peaks in this configuration allows the production of light that appears to be substantially white in color from two peak emission bands to which the human eye is relatively sensitive. Thus, a single light-emitting element is capable of producing light that appears white to the human observer and can match the CIE chromaticity coordinates for a wide range of daylight white points. This later fact is exemplified in FIG. 4, which shows the three most efficient spectra 20, 22, and 24 for forming the three most common daylight white points of D50, D65, and D93 from a pair of 30 nm wide emission peaks. As shown, the three spectra contain a first emission peak at 450, 452, and 448 nm, respectively, as well as a second emission peak of 571, 569, and 566 nm, respectively. Notice that each of the emission spectra contain two separate and distinct peaks, one of which is near the peak in the human visual sensitivity function shown in FIG. 1, which has a peak between 550 and 560 nm, and, therefore, has a high efficacy for stimulating the human visual system. This high efficacy provides an emissive light-emitting element with high luminance efficiency. For instance, the efficiency with which light from light-emitting elements having these three spectral distributions would be converted from radiance to luminance would be 63, 70 and 53 percent for the D50, D65, and D93 light sources, respectively. These efficiencies compare vary favorably to most other emitter spectral distributions that could be employed, especially broadband spectra. For example, a light source having a single broadband spectral distribution, equivalent to a blackbody radiator at temperatures of 5000, 6500, and 9300 degrees Kelvin would have conversion efficiencies of only 30, 28 and 25 percent, all of which are half as efficient as the optimal spectral distributions provided by a device of the present invention.

Figure 4:
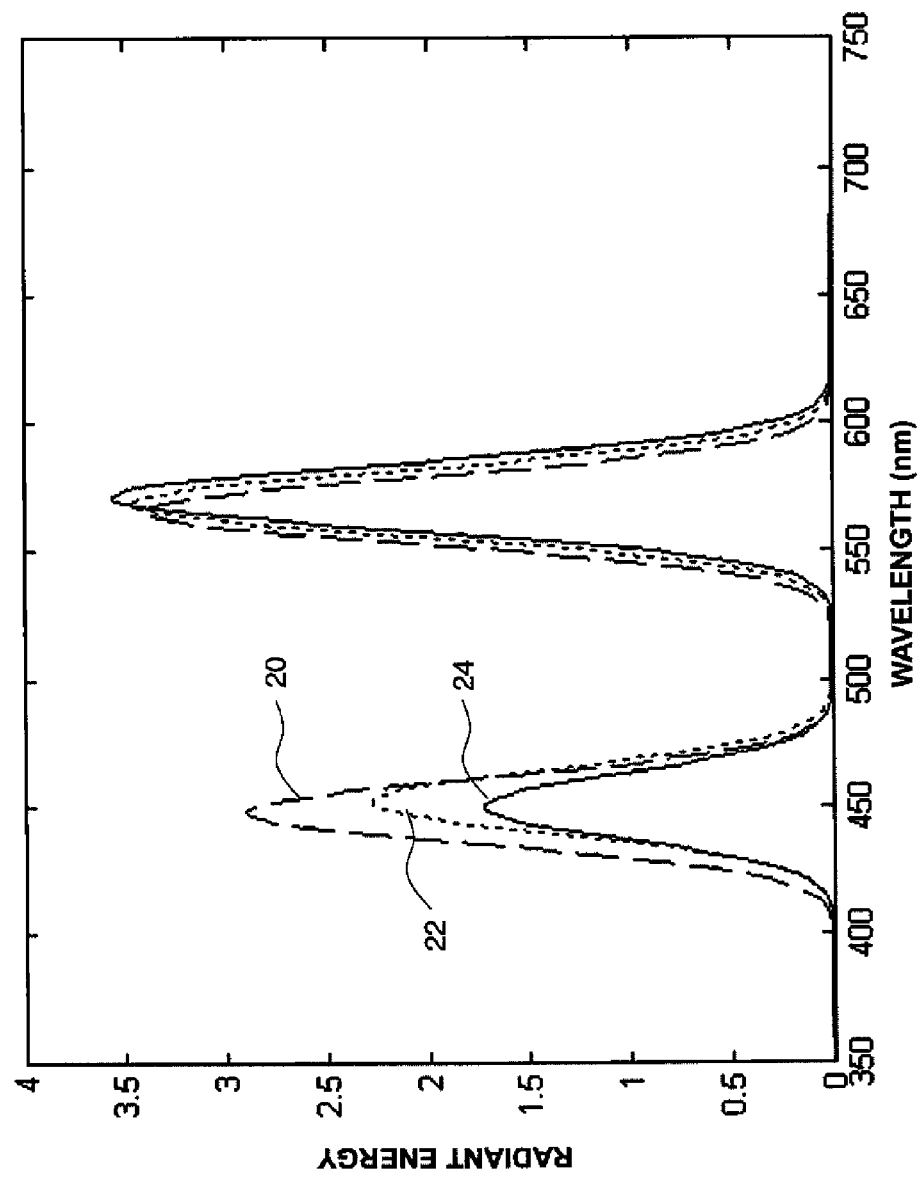
FIG. 4 illustrates spectral power distributions for three separate light-emitting elements according to three different embodiments of the present invention; wherein each light-emitting element produces a white light having chromaticity coordinates corresponding to different color temperatures.

It is worth noting that the most efficient the bimodal distributions shown in FIG. 4 all provide a first peak between 410 nm and 490 nm and a second peak between 520 nm and 620 nm, as in at least one embodiment of the present invention. However, it is further worth noting that actually, these spectra more preferably provide a first peak between 440 nm and 460 nm and a second peak between 560 nm and 580 nm. In yet another embodiment, these spectra provide a first peak between 448 and 452 nm and a second peak between 565 and 575 nm.

Preferably, the bi-modal spectral distribution of light from the near white light-emitting element, for emitting a near white color of light, will be achieved by providing a quantum dot light-emitting layer having a bi-modal size distribution of quantum dots, which allows the formation of a single light-emitting element from two separate sizes of quantum dots, each size of quantum dot having light output with distinctly different dominant wavelengths. Within this arrangement, the light produced by each distribution of quantum dots will have different luminance efficiencies due to changes in the luminance efficacy of the human visual system as a function of wavelength. The bi-modal size distribution of quantum dots will be formed by a first size of quantum dots, for emitting shorter wavelength light; and a second size of quantum dots, for emitting a longer wavelength of light. The difference in size distributions between the first and the second distribution of quantum dots provides a single emitter having a separation of at least 80 nm between their peak or dominant wavelengths.

Figure 5:
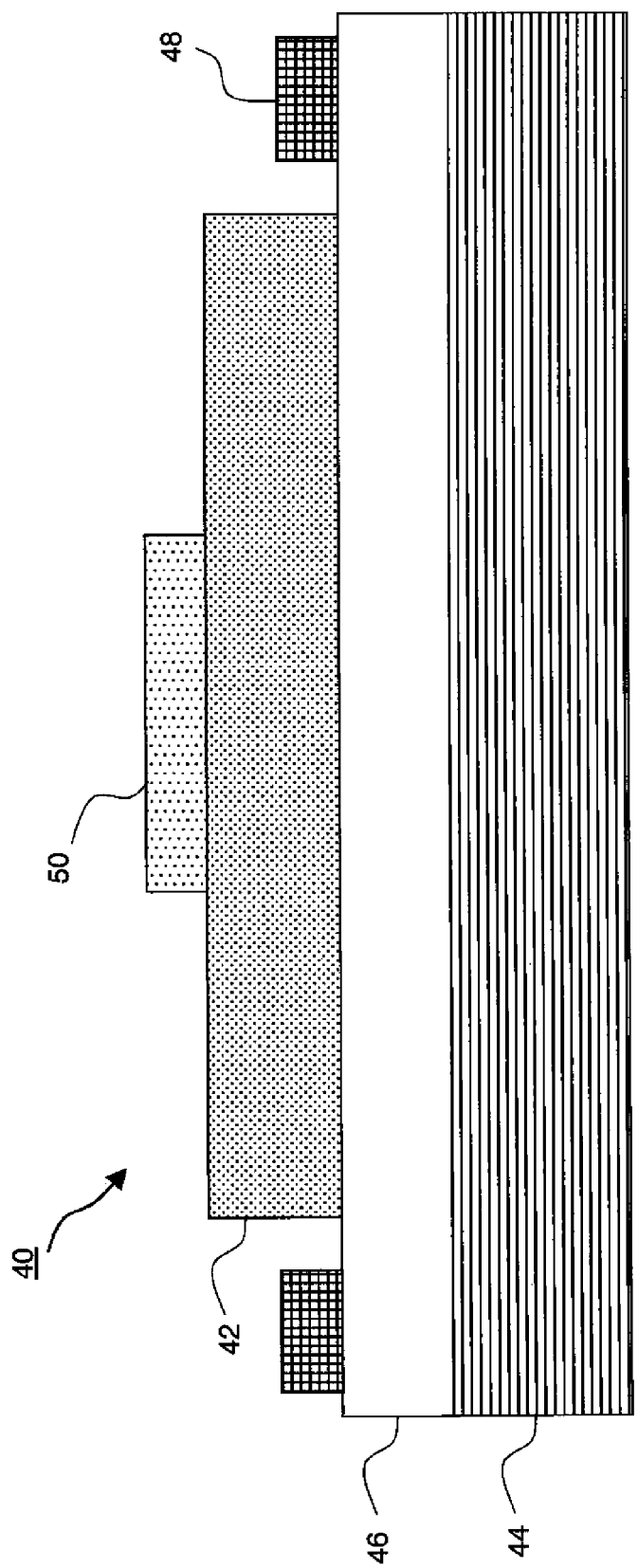
FIG. 5 shows a cross-sectional view of a device according to one embodiment of the present invention.

FIG. 5 shows a cross sectional view of a near-white light-emitting element useful in practicing the present invention. As shown in this figure, the LED device 40 incorporates the quantum dot inorganic light-emitting layer 42. A substrate 44 supports the deposited semiconductor and metal layers; its only requirements are that it is sufficiently rigid to enable the deposition processes and that it can withstand the thermal annealing processes (maximum temperatures of ~285° C.). It can be transparent or opaque. Possible substrate materials are glass, silicon, metal foils, and some plastics. The next deposited material is an anode 46. For the case where the substrate 44 is p-type Si, the anode 46 is deposited on the bottom surface of the substrate 44. A suitable anode metal for p-Si is Al. It can be deposited by thermal evaporation or sputtering. Following its deposition, it will preferably be annealed at ~430° C. for 20 minutes. For all of the other substrate types named above, the anode 46 is deposited on the top surface of the substrate 44 and is comprised of a transparent conductor, such as, indium tin oxide (ITO). Sputtering or other well-known procedures in the art can deposit the ITO. The ITO is typically annealed at ~300° C. for one hour to improve its transparency. Because the sheet resistance of transparent conductors, such as, ITO, are much greater than that of metals, bus metal 48 can be selectively deposited through a shadow mask using thermal evaporation or sputtering to lower the voltage drop from the contact pads to the actual device. Inorganic light emitting layer 42 is deposited next. It can be dropped or spin cast onto the transparent conductor (or Si substrate). Other deposition techniques, such as, inkjetting the colloidal quantum dot-inorganic nanoparticle mixture is also possible. Following the deposition, the inorganic light-emitting layer 42 is annealed at a preferred temperature of 270° C. for 50 minutes. Lastly, a cathode 50 metal is deposited over the inorganic light-emitting layer 42. Candidate cathode 50 metals are ones that form an ohmic contact with the material comprising the inorganic nanoparticles 42. For example, in a case where the quantum dots are formed from ZnS inorganic nanoparticles, a preferred metal is Al. It can be deposited by thermal evaporation or sputtering, followed by a thermal anneal at 285° C. for 10 minutes. Those skilled in the art can also infer that the layer composition can be inverted, such that, the cathode 50 is deposited on the substrate 44 and the anode 46 is formed on the inorganic light emitting layer 42. In this configuration, when the substrate 44 is formed from Si, the substrate 44 is n-type Si.

Although not shown in FIG. 3, a p-type transport layer and an n-type transport layer may be added to the device to surround the inorganic light-emitting layer 42. As is well-known in the art, LED structures typically contain doped n- and p-type transport layers. They serve a few different purposes. Forming ohmic contacts to semiconductors is simpler if the semiconductors are doped. Since the emitter layer is typically intrinsic or lightly doped, it is much simpler to make ohmic contacts to the doped transport layers. As a result of surface plasmon effects, having metal layers adjacent to emitter layers results in a loss of emitter efficiency. Consequently, it is advantageous to space the emitter layers from the metal contacts by sufficiently thick (at least 150 nm) transport layers. Finally, not only do the transport layers inject electron and holes into the emitter layer, but, by proper choice of materials, they can prevent the leakage of the carriers back out of the emitter layer. For example, if the inorganic quantum dots in the light-emitting layer 42 were composed of $ZnS_{0.5}Se_{0.5}$ and the transport layers were composed of ZnS, then the electrons and holes would be confined to the emitter layer by the ZnS potential barrier. Suitable materials for the p-type transport layer include II-VI and III-V semiconductors. Typical II-VI semiconductors are ZnSe, ZnS, or ZnTe. Only ZnTe is naturally p-type, while ZnSe and ZnS are n-type. To get sufficiently high p-type conductivity, additional p-type dopants should be added to all three materials. For the case of II-VI p-type transport layers, possible candidate dopants are lithium and nitrogen. For example, it has been shown in the literature that $Li_3N$ can be diffused into ZnSe at ~350° C. to create p-type ZnSe, with resistivities as low as 0.4 ohm-cm.

Suitable materials for the n-type transport layer include II-VI and III-V semiconductors. Typical II-VI semiconductors are ZnSe or ZnS. As for the p-type transport layers, to get sufficiently high n-type conductivity, additional n-type dopants should be added to the semiconductors. For the case of II-VI n-type transport layers, possible candidate dopants are the Type III dopants of Al, In, or Ga. As is well known in the art, these dopants can be added to the layer either by ion implantation (followed by an anneal) or by a diffusion process. A more preferred route is to add the dopant in-situ during the chemical synthesis of the nanoparticle. Taking the example of ZnSe particles formed in a hexadecylamine (HDA)/TOPO coordinating solvent, the Zn source is diethylzinc in hexane and the Se source is Se powder dissolved in TOP (forms TOPSe). If the ZnSe were to be doped with Al, then a corresponding percentage (a few percent relative to the diethylzinc concentration) of trimethylaluminum in hexane would be added to the syringe containing TOP, TOPSe, and diethylzinc. In-situ doping processes like these have been successfully demonstrated when growing thin films by a chemical bath deposition. It should be noted the diode could also operate with only a p-type transport layer or an n-type transport layer added to the structure. Those skilled in the art can also infer that the layer composition can be inverted, such that, the cathode 50 is deposited on the substrate 44 and the anode 46 is formed on the p-type transport layer. For the case of Si supports, the substrate 44 is n-type Si.

The light-emitting layer 42 will preferably be comprised of a plurality of light emitting cores, each core having a semiconductor material that emits light in response to recombination of holes and electrons, each such light emitting core defining a first bandgap; a plurality of semiconductor shells formed respectively about the light emitting cores to form core/shell quantum dots, each such semiconductor shell having a second bandgap wider than the first bandgap; and a semiconductor matrix connected to the semiconductor shells to provide a conductive path through the semiconductor matrix and to each such semiconductor shell and its corresponding light-emitting core so as to permit the recombination of holes and electrons.

Figure 6:
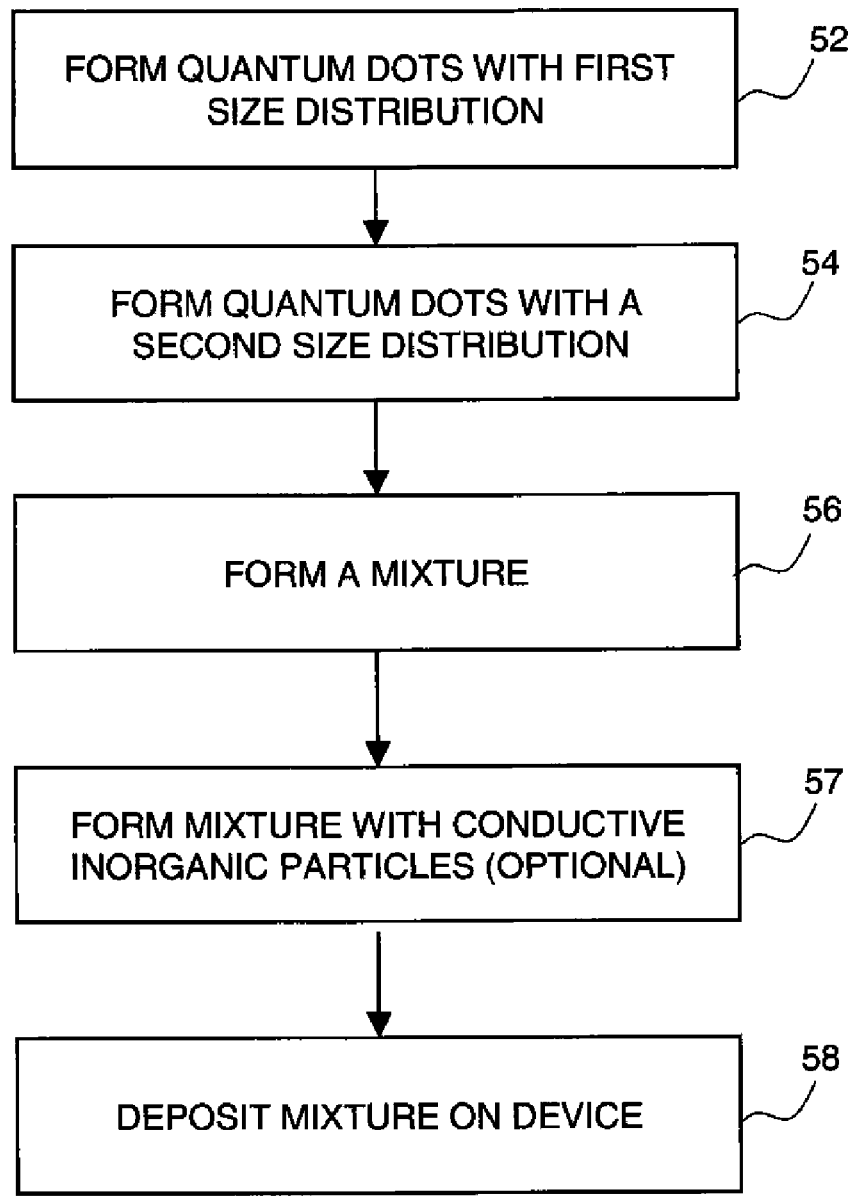
FIG. 6 is a flow chart depicting one set of steps for forming the light-emitting layer of a device of the present invention.

At least one of the two electrodes (i.e., anode 46 or cathode 50) will typically be formed of a transparent or semi-transparent material such as ITO or IZO. The opposing electrode will often be formed of a highly reflective material such as aluminum or silver, but may also be transparent. In a typical embodiment, the anode will be transparent and the cathode will be reflective, but the opposing structure is also viable. The hole and electron transport materials may be formed from inorganic semi-conducting materials as described above, and alternatively may also be formed from organic semi-conducting materials. Additional layers may also be placed into the structure to promote other functions, such as electron and hole injection from the electrodes; or electron or hole blocking layers to prevent electrons or holes from traveling past the light-emitting layer to recombine with oppositely charged particles near one of the electrodes. The creation of a first light-emitting layer comprised of quantum dots for producing light with at least a bi-modal spectral distribution will generally involve synthesizing quantum dots of a first and second size within separate steps and then depositing these quantum dots in the correct proportion into the light-emitting layer of a device. One process for fabricating such a device is depicted in FIG. 6. In this process, a first size distribution of quantum dots will be formed in operation 52. One such process has been discussed in co-pending U.S. application Ser. No. 11/226,622, filed Sep. 14, 2005 by Kahen, which is hereby included by reference. A second size distribution of quantum dots will also be formed 54 using a similar process, but will result in different sizes by varying the parameters of the reaction (e.g., time, temperature, or concentrations) that are used to form the quantum dots. A mixture of the two distributions will then be formed 56 by combining the resulting quantum dots into a common material to form a mixture containing quantum dots from each of the two size distributions. This mixture will be contain a proportion of the number of quantum dots from the first size distribution to the number of dots from the second size distribution such that this proportion is approximately equal to the desired area under each of the peaks within the desired spectral power distribution, such as the one shown in FIG. 3. That is the proportion of the number of quantum dots from the size distribution corresponding to light emission of a first peak (e.g., 32) to the number of quantum dots from the size distribution corresponding to light from a second peak (e.g., 34) will be equal to the area under the first peak 32 to the area under the second peak 34. An optional operation 57 of forming a mixture of the two distributions or sizes of quantum dots with additional conductive inorganic particles may be performed. These additional conductive inorganic particles can, in some embodiments, be useful in forming a semi-conductor matrix, promoting the flow of holes and electrons to the quantum dots. Once this mixture of quantum dots is formed, the quantum dot mixture is deposited in operation 58 onto the device using conventional means.

Figure 7:
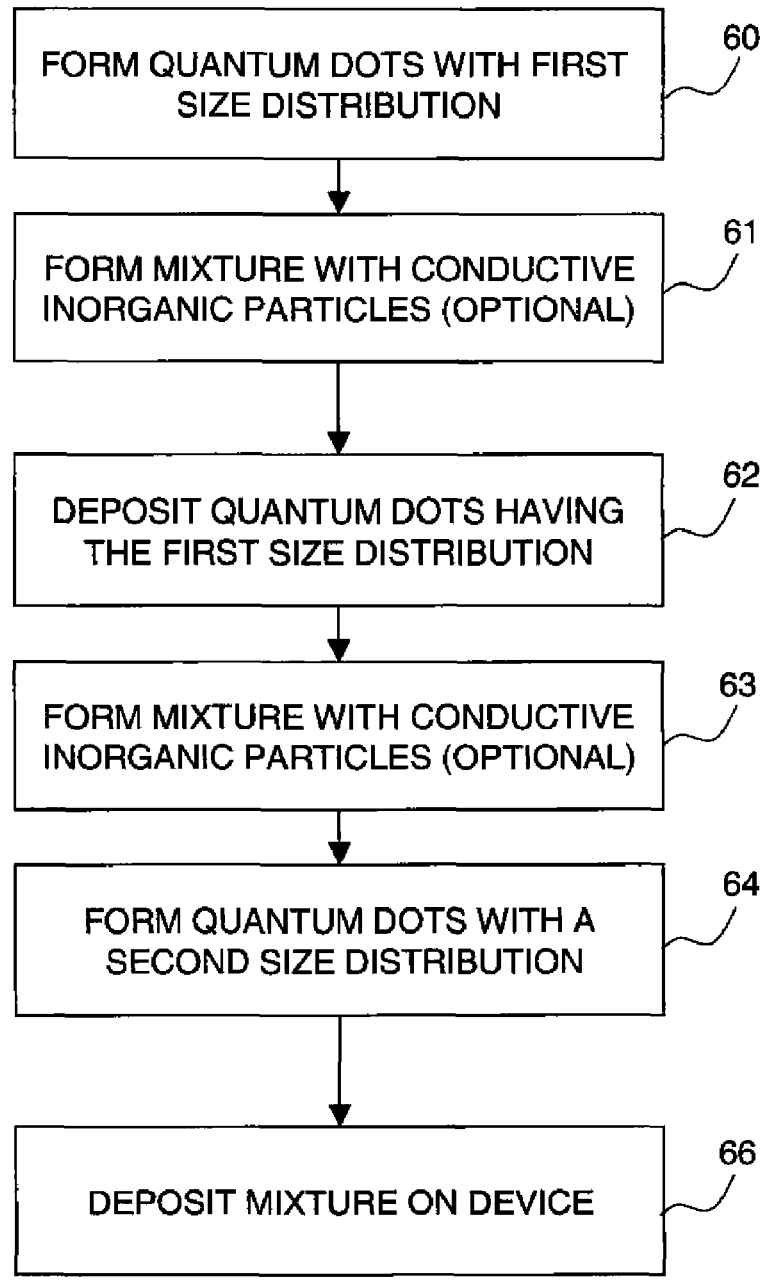
FIG. 7 is a flow chart depicting one set of steps for forming the light-emitting layer of a device of the present invention.

In an alternate process, the device will be fabricated as depicted in FIG. 7. As shown in this figure, a first size distribution of quantum dots is formed in operation 60. The resulting quantum dots having this first size distribution are deposited in operation 62 within a light-emitting region defined by a pair of electrodes. A second size distribution of quantum dots is also formed in operation 64. This second size distribution of quantum dots is then deposited in operation 66 in a spatially distinct area within the same light-emitting region as the first size distribution of quantum dots. The two spatially distinct areas where the quantum dots, having the first size distribution, is deposited and where the quantum dots, having the second size distribution, is deposited will preferably be within the same plane of the device, requiring that the dots from the two distributions be patterned side by side but between the same pair of electrodes. Alternatively, they may also be stacked in a tandem layer within the device. Optional operational steps 61, 63 of forming a mixture of each of the two distributions or sizes of quantum dots with additional conductive or semiconductive inorganic particles may be performed. In one embodiment, the electro-luminescent device of the present invention may be employed in a light source, such as a general lighting fixture or a backlight for a display, such as a liquid crystal display. When employed in a general-purpose light, the device may only have light-emitting elements emitting a near white color of light. Alternatively, the near white light-emitting element of the present invention may be employed in combination with other-colored light-emitting elements.

Figure 8:
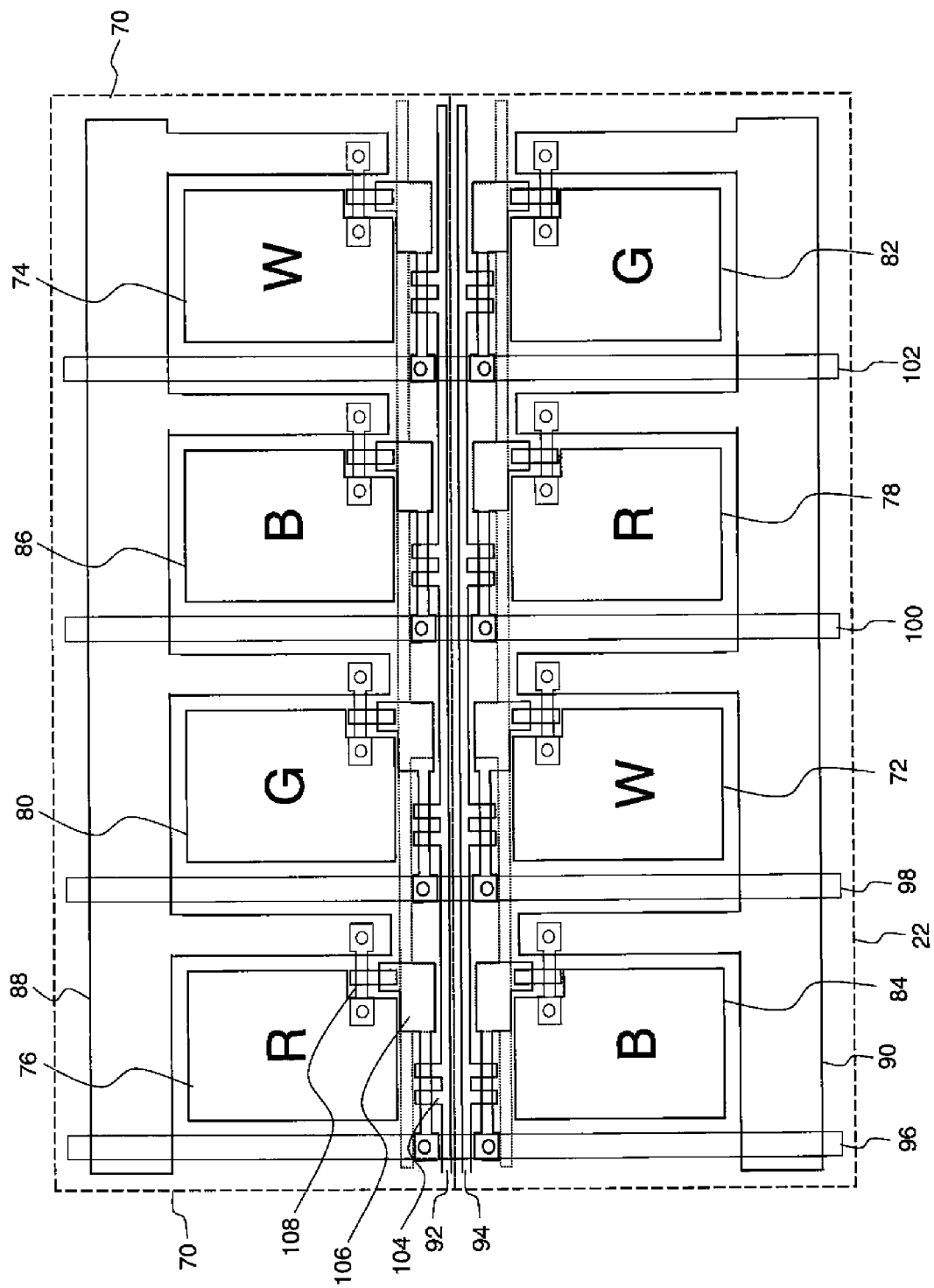
FIG. 8 shows a portion of a top view of a display useful for employing a light-emitting element of the present invention.

In one particularly preferred embodiment, the electro-luminescent device of the present invention is a full-color display and the array of light-emitting elements includes at least three additional light-emitting elements for emitting at least three additional colors of light. Within the full-color display each of the at least three additional light-emitting elements has a light-emitting layer comprised of quantum dots for emitting light having a single spectral peak and will, therefore, typically have a uni-modal distribution of sizes. These light-emitting elements will typically be patterned beside each other to form a full-color display, a portion 70 of which is depicted in FIG. 8. As shown in this figure, such a full-color display device will have an array of light-emitting elements that includes one or more of the near white light-emitting elements 72, 74, for emitting a near white color of light, which will typically appear white to human observers, as well as additional light-emitting elements for emitting red light 76, 78, green light 80, 82, and blue light 84, 86. While the portion 70 of the full-color display as shown in FIG. 8 applies active matrix circuitry to drive the light-emitting elements of the display device, the display device may also apply passive-matrix circuitry.

As shown in FIG. 8, active matrix circuitry for driving a device of the present invention will typically include power lines 88, 90 for providing current to the light-emitting elements, select lines 92, 94 for selecting a row of circuits, drive lines 96, 98, 100, 102 for providing a voltage to control each of the circuits, select TFTs 104 for allowing the voltage for a drive line 96, 98, 100, 102 to be provided only to the light-emitting elements in a column that receive a select signal on a select line 92 or 94, a capacitor 106 for maintaining a voltage level between each line refresh and a power TFT 108 for controlling the flow of current from the power lines 88, 90 to one of the electrodes for each light-emitting element.

Figure 9:
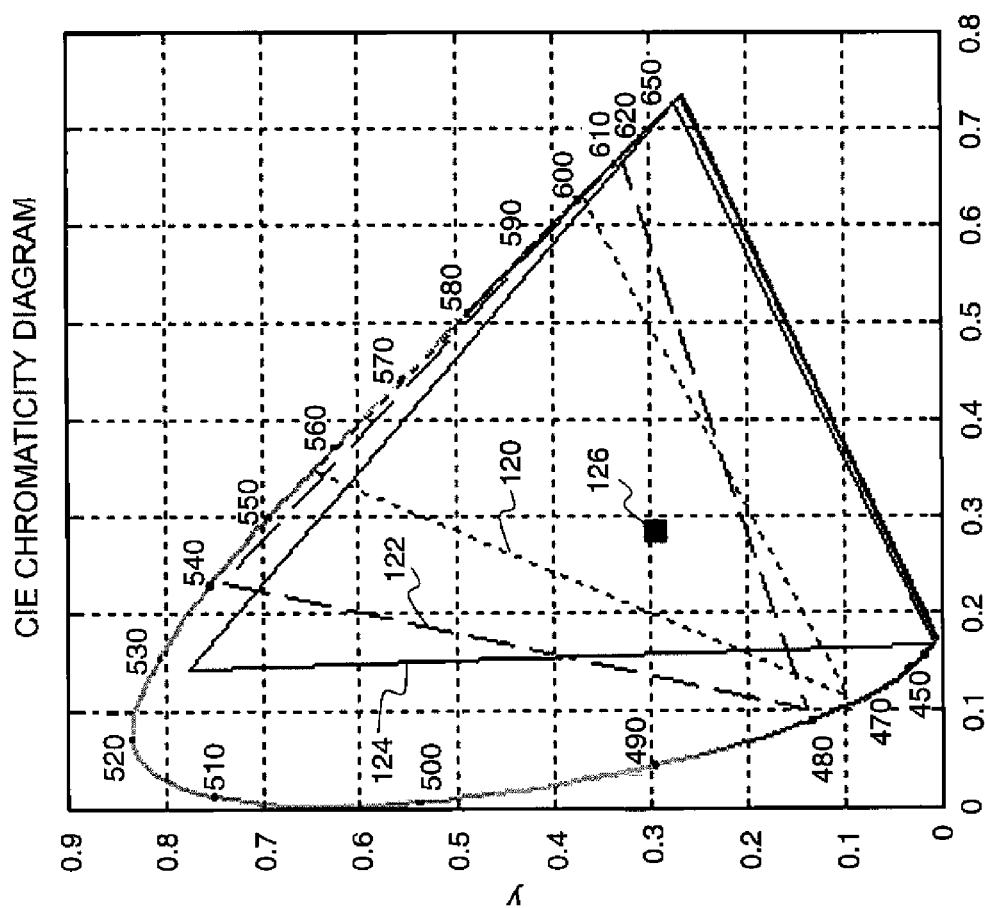
FIG. 9 shows a CIE 1931 chromaticity diagram depicting coordinates defining three different potential color gamuts of displays according to various embodiments of the present invention.

In such a display, the color of light emitted by the additional light-emitting elements will define the color gamut of the display wherein the color gamut is defined as the area enclosed by the chromaticity coordinates of the at least three additional light-emitting elements for emitting at least three additional colors of light. This enclosed area is often expressed as a percentage of the area that is defined by chromaticity coordinates specified in the NTSC standard. FIG. 9 shows three potential color gamuts 120, 122, 124 that may be created by applying three independent sets of additional light-emitting elements when plotted in the CIE 1931 chromaticity coordinate space. Included in this figure, is a first color gamut 120 having an area that is equal to approximately 70% the NTSC color gamut area, which is typical of traditional flat panel displays, a second color gamut 122 having an area that is equal to approximately 100% of the NTSC color gamut area, and a third color gamut 124, having an area that is approximately 138% of the area of the NTSC color gamut area, which is only achievable in displays having extraordinarily narrow band emitters such as laser displays and displays employing quantum dots. Also shown in this figure is the chromaticity coordinate 126 of a near white light-emitting element for emitting a near white color of light having the spectral content shown in FIG. 3.

Figure 10A:
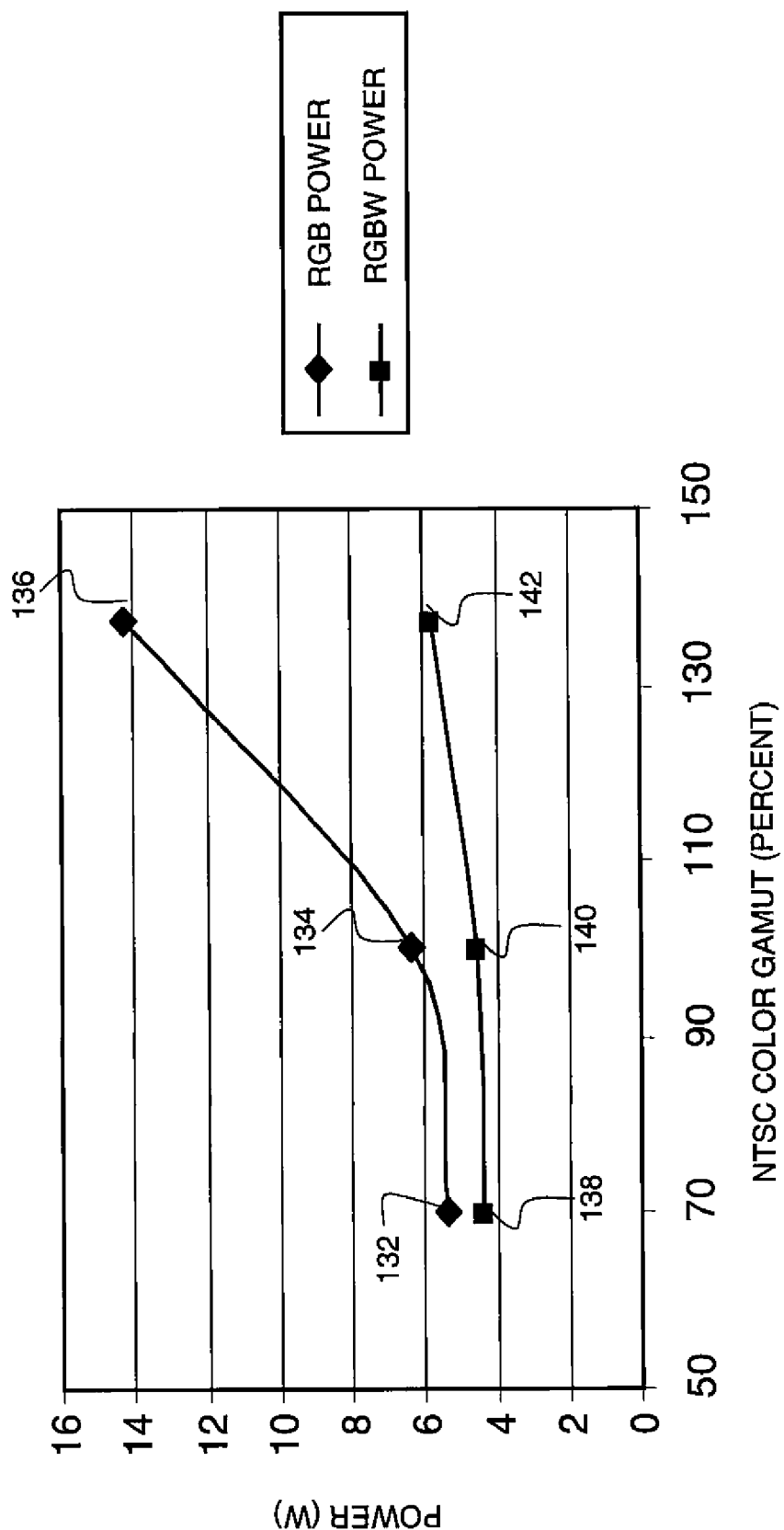
FIG. 10a is a plot showing the power consumed by a display having red, green and blue primaries as shown in FIG. 9 as compared to the power consumed by a display including the same red, green and blue primaries as well as light-emitting element according to the present invention.
Figure 10B:
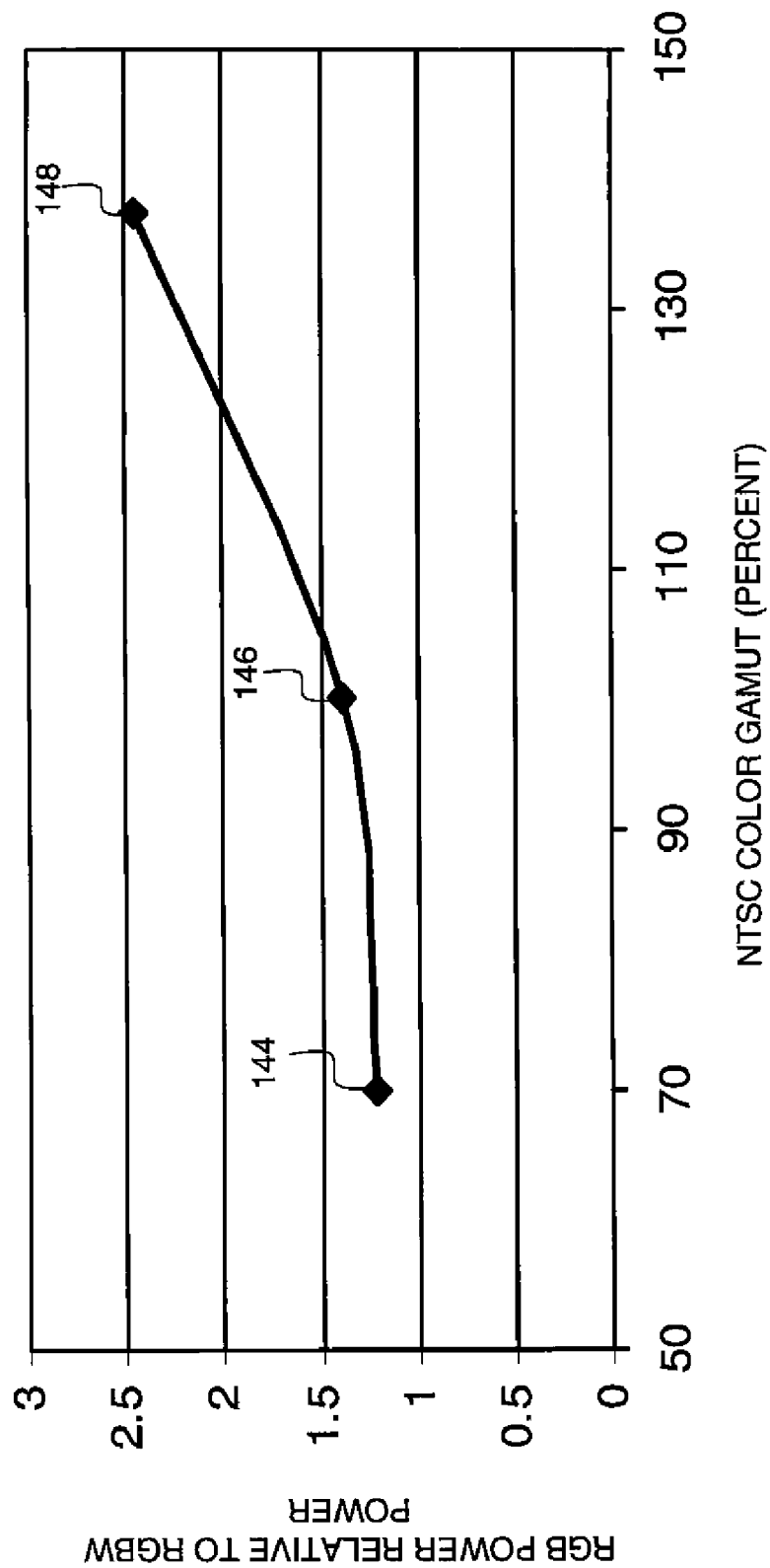
FIG. 10b is a plot showing the relative power consumed by a display having red, green and blue primaries as shown in FIG. 9 to the power consumed by a display including the same red, green and blue primaries as well as light-emitting element according to the present invention.

In a full-color display of the present invention, the primary purpose of the near white light-emitting element having at least a bi-modal spectral light distribution is to reduce power consumption of the display. The effect of employing this light-emitting element upon the power consumption of a full color display of the present invention is shown in FIG. 10a. This figure shows the relative average power consumption of three displays 132, 134, 136 having only the additional three light-emitting elements as depicted in FIG. 8 as having color gamuts 120, 122, and 124. However, when the same near white light-emitting element for emitting a near white color of light is added to these displays and images are rendered appropriately, the average power consumption of the display is reduced to the relative power consumptions 138, 140, and 142, respectively. FIG. 10b shows the ratios 144, 146, 148 of the relative average power consumption values of the three displays 132, 134 136 having only red, green, and blue primaries to the relative average power consumption values 138, 140, 142 for a display having the near white light-emitting element for emitting the near white color of light as a function of the color gamut of the display. As shown in this figure, the advantage of this emitter varies significantly as a function of the color gamut of the display. As shown, the presence of the near white light-emitting element for emitting a near white color of light that has at least a bi-modal spectral distribution significantly improves the power consumption of displays having a color gamut that is 100% of the NTSC color gamut or greater.

The color gamuts shown in FIG. 9 were obtained by selecting different dominant wavelengths for the additional light-emitting elements having bandwidths of 30 nm. To obtain a color gamut that is 100% of the NTSC color gamut or greater the dominant wavelength of the light-emitting element for emitting red light 78, 88 will be between 610 and 720 nm, the dominant wavelength of the light-emitting element for emitting green light 80, 82 will be between 500 and 550 nm, and the dominant wavelength of the light-emitting element for emitting blue light 84, 86 will be between 380 and 450 nm. Color gamut may also be affected by adjusting the bandwidth of the emitters. To obtain a color gamut greater than 100% of the NTSC color gamut, the bandwidth of the light-emitting element as defined by the full width of the emission spectrum at half the emitter's peak luminance for emitting red, green, and blue light must each be less than 80 nm.

Within a display system employing quantum dot light-emitting elements, the radiant efficiency of the light-emitting element is relatively independent of the color of light emission. Therefore, it may be assumed that the radiant efficiency of each of the different colors of the light-emitting elements will be relatively equivalent. Any reduction in display power consumption then is due to the sensitivity of the human eye to the spectral energy of each light-emitting element. Table 1 shows the relative luminance efficiencies (efficiency with which the human eye converts radiant energy having the peak wavelength and a bandwidth of 30 nm to luminance) for each of the primaries depicted within FIG. 9. Included are the relative efficiencies of the near white light-emitting element for emitting a near white color of light (labeled white efficiency) and the efficiencies for each of the three additional light-emitting elements (labeled red, green, and blue efficiency) for each of the three-color gamuts. As shown, the relative luminance efficiency of the near white light-emitting elements for emitting a near white color of light is higher than the relative luminance efficiency of the red and blue light-emitting elements. That is, the luminance efficiency of the near white light-emitting element for emitting a near white color of light is higher than the luminance efficiency of at least two of the at least three additional light-emitting element for emitting at least three colors of light.

TABLE 1

| NTSC Color Gamut | Red Efficiency | Green Efficiency | Blue Efficiency | White Efficiency |
|---|---|---|---|---|
| 138 | 0.7 | 75.3 | 0.7 | 57.6 |
| 100 | 1.1 | 89.7 | 16.0 | 48.59 |
| 70 | 6.7 | 96.5 | 13.0 | 44.6 |

Figure 11:
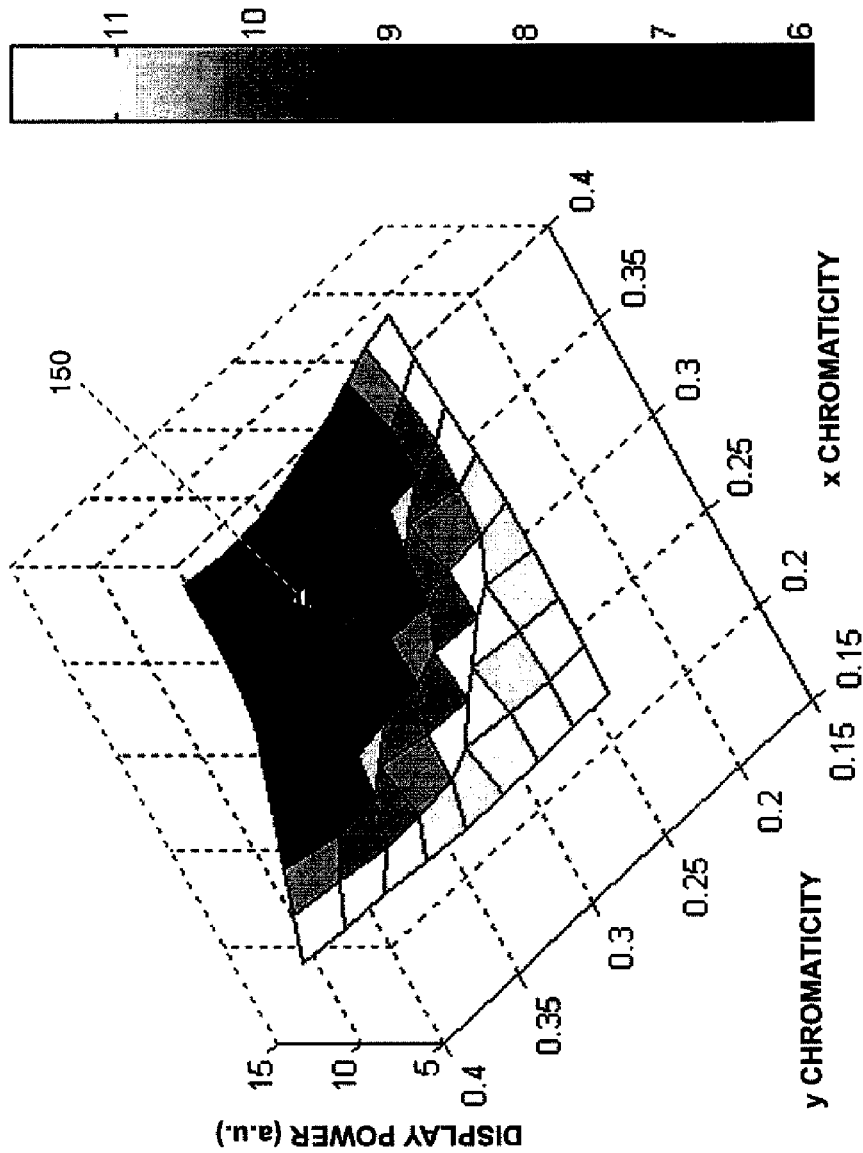
FIG. 11 is a three-dimensional plot showing the power consumed by a display of the present invention as a function of the CIE 1931 chromaticity coordinates of a light-emitting element that is constructed according to the present invention.

To obtain the maximum reduction in display power consumption, it is important that the 1931 CIE chromaticity coordinates of the near white light-emitting element for emitting a near white color of light be approximately equal to the CIE chromaticity coordinates of the white point of the display. Herein, the white point of the display is defined as the color that is displayed when an object having maximum RGB code values in the RGB color space is presented on the display. A plot showing average power consumption of a full color display as a function of the 1931 CIE chromaticity coordinates of the near white light emitting element for emitting a near white color of light is shown in FIG. 11. As this figure shows, the minimum power consumption 150 occurs when the color of the near white light-emitting element has x and y chromaticity coordinates of 0.310, and 0.318 when the white point of the display has x and y chromaticity coordinates of 0.285, 0.293, respectively. However, the chromaticity coordinates of the near white light-emitting element having the minimum power consumption will depend in part upon the white point of the display, the chromaticity coordinates of the red, green, and blue primaries of the display and the exact spectra of the white light-emitting element. The chromaticity coordinates of the near white light-emitting element for emitting a near white color of light may lie within 0.2 of both the x and y chromaticity coordinates of the white point of the display, and may lie within 0.1 of both the x and y chromaticity coordinates of the chromaticity coordinates of the white point of the display and may typically lie within 0.05 of the x and y chromaticity coordinates of the white point of the display.

Figure 12:
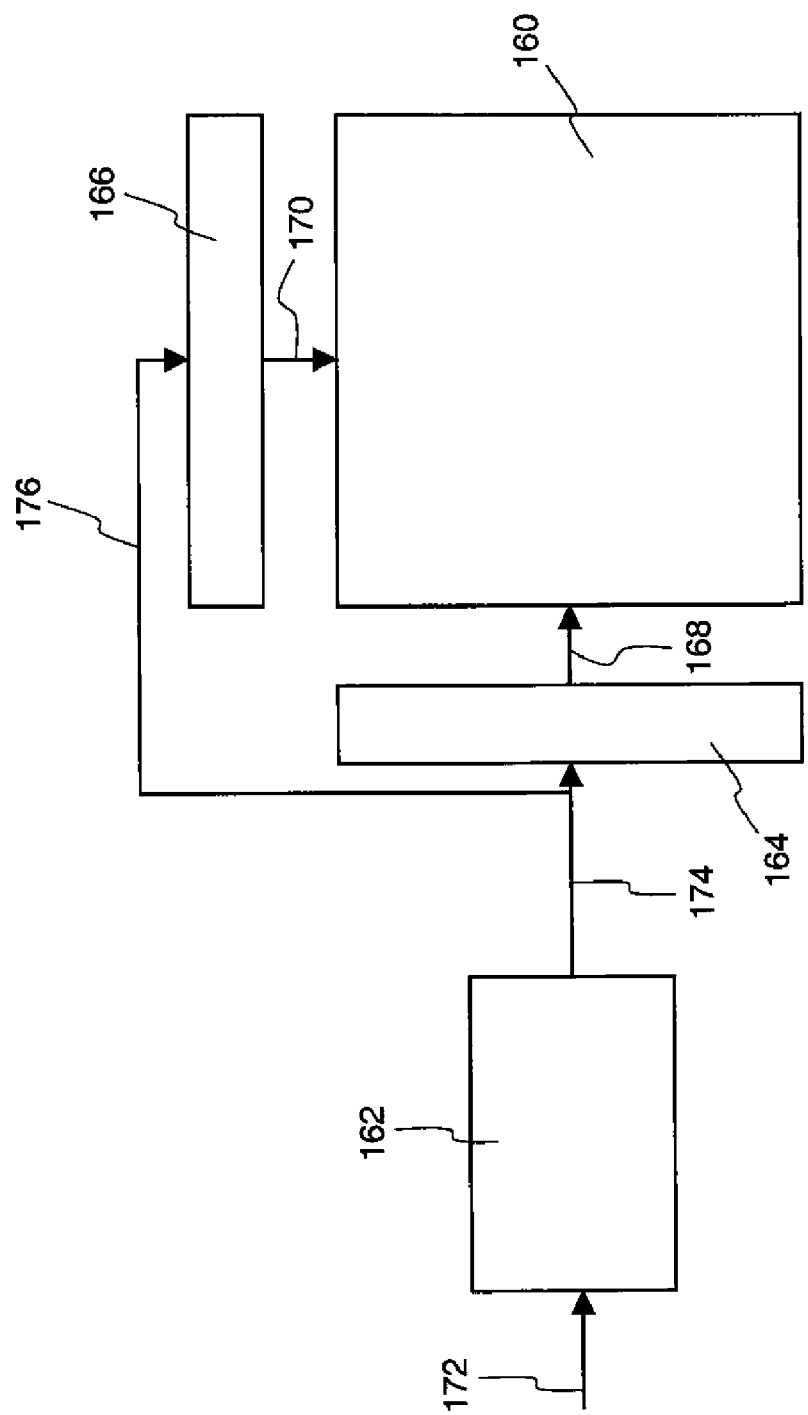
FIG. 12 shows a system for employing a display of the present invention.

The full color display of the present invention may be employed within a display system as shown in FIG. 12. As shown in FIG. 12, such a display system includes a display 160, according to one embodiment of the present invention. A portion of display 160 is shown in FIG. 8. One display processor 162, provides appropriate row 168 and column 170 signals to the display 160. Typically, processor 162 will include a row driver 164, and a column driver 166. The display processor 162 will typically receive an input digital RGB signal 172 for the image that is to be displayed and convert this signal to provide a synchronization signal 174 to row driver 164 and a four or more color signal 176 to column driver 166 for driving the near white light-emitting element, for emitting a near white color, and the three or more additional light-emitting elements. Methods for performing this conversion are known in the art and include processes such as described in U.S. Pat. Nos. 6,897,876 and 6,885,380 as well as and co-pending U.S. application Ser. Nos. 11/429,884, 11/429,839, 11/429,704, and 11/429,838, all filed May 8, 2006, by Miller et al., all of which are herein included by reference. Generally, these methods include subtracting at least a portion of the red, green, and blue code values from these input code values and assigning some proportion of this same value to the drive value of the near white light-emitting element for emitting a near white color of light. In this way, the near white light-emitting element for emitting a near white color of light is preferentially employed to produce luminance that would have otherwise been produced by the red, green, and blue light-emitting elements. Once this signal is received, row driver 164 and column driver 166 will then provide select signals 168 on the select lines 92, 94 and drive signals 170 on the drive lines 96, 98, 100, 102 to the display 160.

Figure 13:
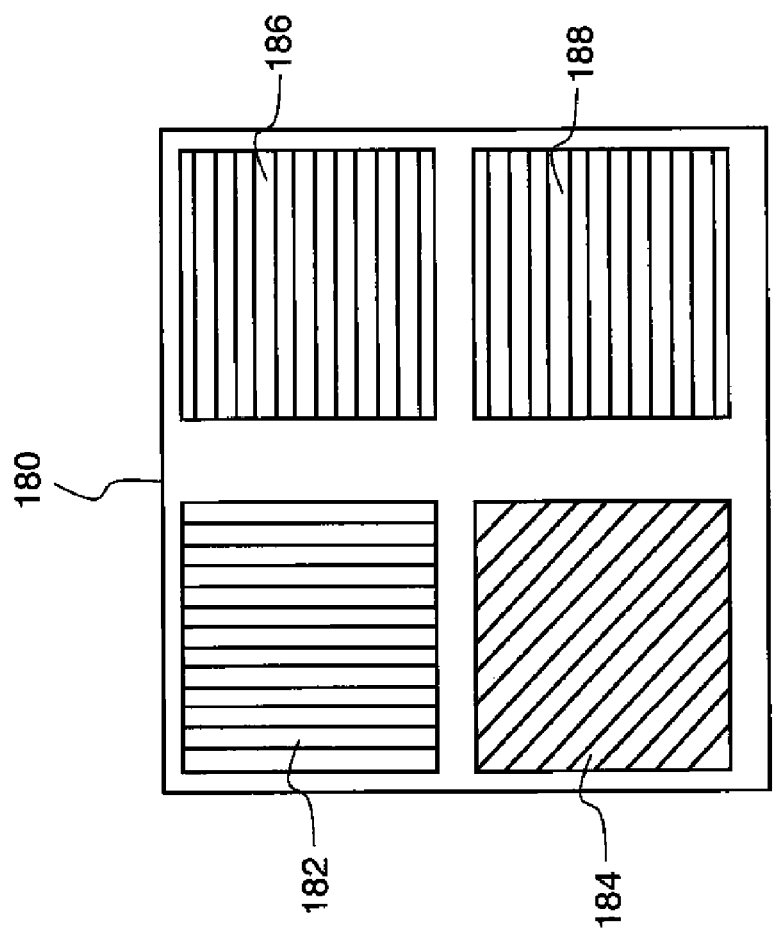
FIG. 13 shows an arrangement of red, green, blue and white light-emitting elements, useful for practicing a display of the present invention.

It should be noted, that the full-color display shown in FIG. 8 has one particular arrangement of light-emitting elements useful in practicing the present invention. Many other similar arrangements are known in the art such as described in U.S. patent application Ser. Nos. 10/859,314, 10/961,506, 10,821, 353, and 11/616,330, all of which are herein included by reference. One additional exemplary arrangement is the quad arrangement of light-emitting elements, such as the arrangement shown in FIG. 13. This figure shows a portion of a display 180 comprising a single arrangement of four light-emitting elements 182, 184, 186, 188, which may be tiled across the entire display surface, wherein the four light-emitting elements are arranged as squares within a square. These light-emitting elements will be comprised of a near white light-emitting element for emitting a near white color of light 182, according to the present invention. Display 180 will typically, also include light-emitting elements for emitting red 184, green 188, and blue 186 light. Although one arrangement of the four elements are shown in this figure, it should be recognized that these four colored light-emitting elements may be arranged in any order within the repeating pattern. Further, alternative arrangements may be employed within neighboring repeating patterns.

Figure 14:
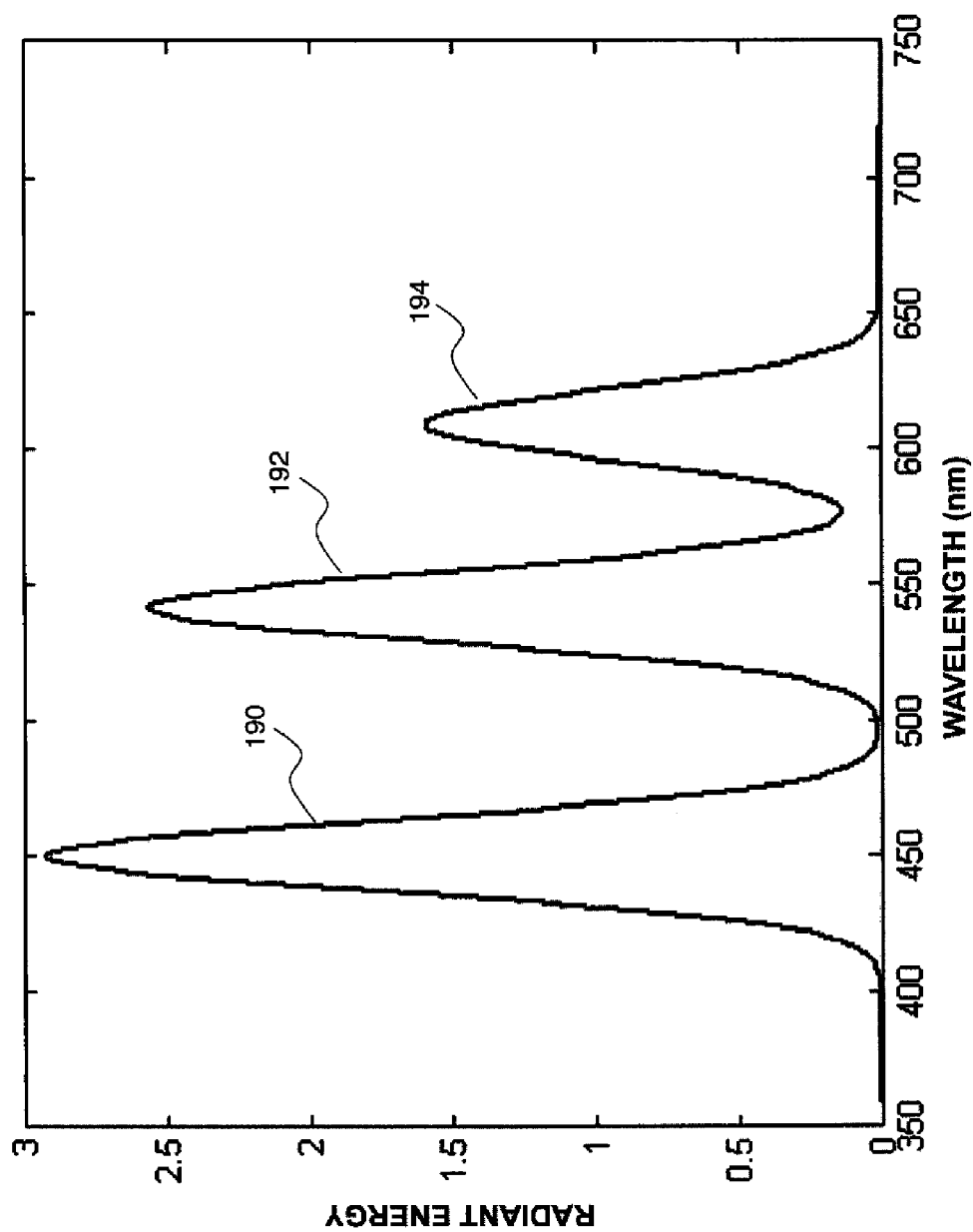
FIG. 14 shows a spectral power distribution for a light-emitting element having exactly three modes, according to one embodiment of the present invention.

The embodiments of the present invention have each been discussed as providing a light-emitting element having at least a bi-modal spectral distribution. It is possible to construct light-emitting elements having three or even more spectral peaks, which have reasonable power efficiency compared to a light-emitting element of the present invention having an exact bi-modal spectral distribution. Particularly, it may be advantageous to include a third peak, as shown in FIG. 14. As this figure, shows such a near white light-emitting element may have emission peaks near 450, 540 and 610 nm shown as 190, 192, and 194. However, manufacturing complexity of the devices of the present invention will be increased and the power efficiency of the near white light-emitting element decreases with each additional spectral peak. However, a three-peak emitter has an advantage over an emitter without distinct peaks. The emitter shown in FIG. 14 has a relative luminance efficiency of 47% as opposed to a broadband white emitter producing the same color having a relative luminance efficiency of only 25%. Therefore, it is preferable to have a light-emitting element having exactly a tri-modal distribution, rather than a broadband distribution according to the present invention. To achieve tri-modal near-white devices with particularly high luminance efficiency, it is particularly important that one of the spectral peaks lie near the peak in the human visual sensitivity curve and will therefore, typically be between 550 and 560 nm. A second peak will generally also lie near 450 nm to balance this peak and will generally be between 430 and 470 nm. The third peak may be positioned at almost any other location within the visible spectrum without having a dramatic effect upon power efficiency but will preferably also be located near the peak that lies between 550 and 560 nm.

Figure 15:
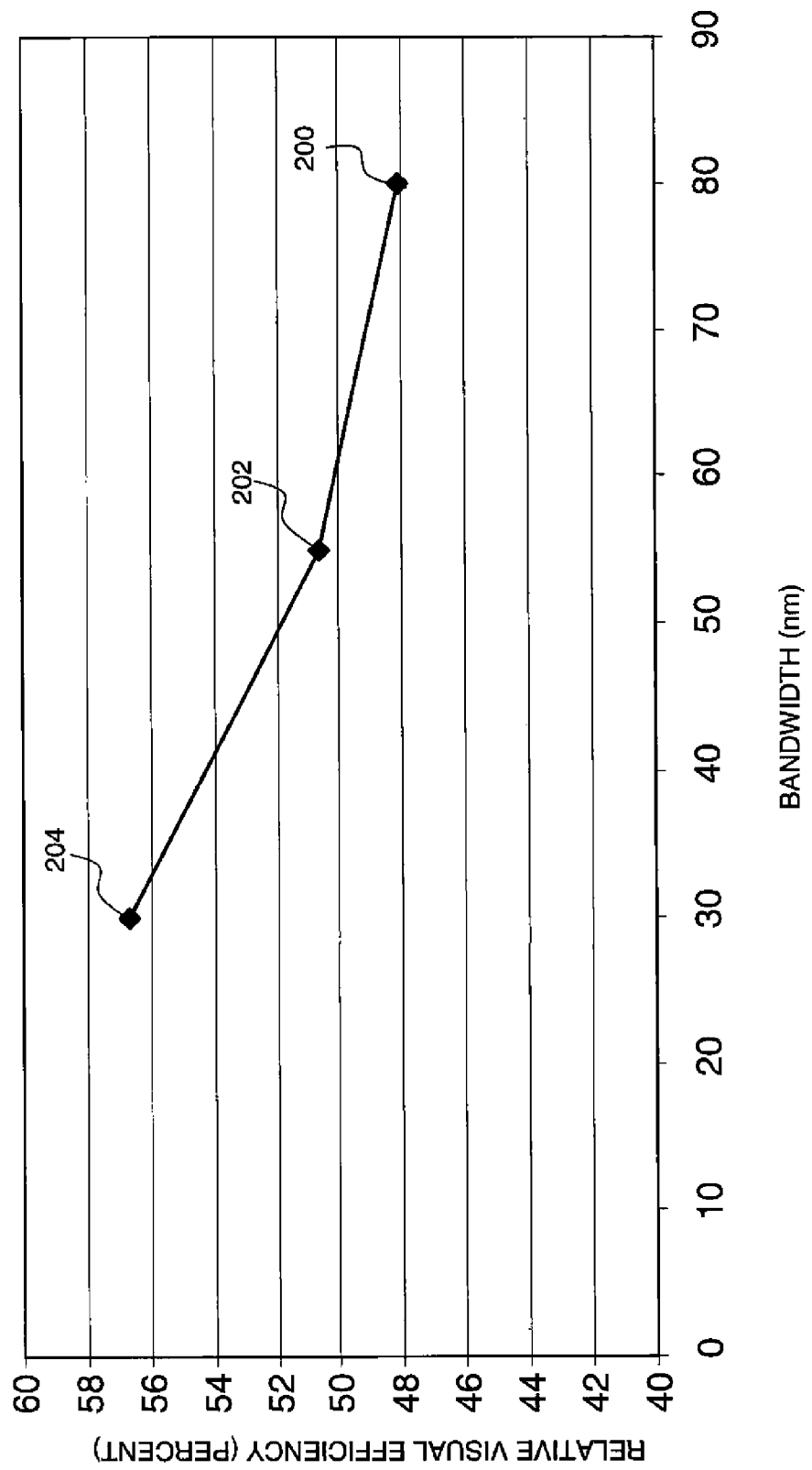
FIG. 15 is a plot showing the relative luminance efficiency for whites formed from peaks having different bandwidths.

It may also be noted that each of the peaks in the spectrum of the near white light emitting element will preferably be narrow. FIG. 15 shows the relative luminance efficiency of the optimal near white light-emitting element with a bimodal distribution of wavelengths as a function of the bandwidth of each of the peaks within the spectrum, wherein the bandwidth is defined as the full width of a spectral peak at half of its maximum amplitude (FWHM). As shown in this figure, the relative luminance efficiency increases as the bandwidth is reduced from 57% when the bandwidth is 80 nm to 51% when the bandwidth is 55 nm and then to 48% when the bandwidth is 30 nm, shown as 200, 202, and 204 in FIG. 15, respectively. These increases in relative luminance efficiencies translate to decreases in display power as the near white light-emitting element is applied within a display. These increases translate to display power values of 6.7 W for a display having a near white light-emitting element having a bimodal distribution with emission peaks having bandwidths of 80 nm to 6.2 W, when the bandwidths are 55 nm to 5.8 W when the bandwidths are 30 nm.

A FWHM value of 80 nm is sufficiently broad to enable sufficiently low cost manufacturing processes for inorganic quantum dot emitters, and to provide a sufficiently narrow spectral width to enable the present invention.

A minimum FWHM of 5 nm is broader than the bandwidth found in laser devices, and can be achieved in high quality manufacturing processes. An improved color efficiency and, therefore, another exemplary embodiment can be achieved, at some increased manufacturing cost, by employing an FWHM of 55 nm. Further improved power efficiency, and, may be practically achieved as demonstrated by the applicant by employing quantum dots having an FWHM of 30 nm.

The invention has been described in detail with particular reference to certain preferred embodiments thereof, but it will be understood that variations and modifications can be effected within the spirit and scope of the invention.

PARTS LIST 2 peak of human eye sensitivity
4 short wavelengths
6 long wavelengths
8 first gamut triangle
10 second gamut triangle
20 D50 spectra
22 D65 spectra
24 D93 spectra
32 first spectral peak
34 second spectral peak
36 inter-modal minimum
40 LED device
42 quantum dot inorganic light-emitting layer
44 substrate
46 anode
48 bus metal
50 cathode
52 form first size distribution operation
54 form second size distribution operation
56 form a mixture operation
57 form mixture with conductive particles operation (optional)
58 deposit mixture operation
60 form first size distribution operation
61 form mixture with conductive particles operation (optional)
62 deposit first size distribution operation
63 form mixture with conductive particles operation (optional)
64 form second size distribution operation
66 deposit second size distribution operation
70 portion of full color display
72 near white light-emitting element
74 near white light-emitting element
76 red light-emitting element
78 red light-emitting element
80 green light-emitting element
82 green light-emitting element
84 blue light-emitting element
86 blue light-emitting element
88 power line
90 power line
92 select line
94 select line
96 drive line
98 drive line
100 drive line
102 drive line
104 select TFT
106 capacitor
108 power TFT
120 70% NTSC color gamut
122 100% NTSC color gamut
124 138% NTSC color gamut
126 chromaticity coordinate of near white light emitting element
132 RGB power consumption value
134 RGB power consumption value
136 RGB power consumption value
138 RGBW power consumption value
140 RGBW power consumption value
142 RGBW power consumption value
144 power Ratio for 70% NTSC color gamut
146 power Ratio for 100% NTSC color gamut
148 power ratio for 138% NTSC color gamut
150 minimum power consumption
160 display
162 display processor
164 row driver
166 column driver
168 row signals
170 column signals
172 input RGB signal
174 row driver synchronization signal
176 four or more color drive signal
180 display portion
182 near white light-emitting element
184 red light-emitting element
186 blue light-emitting element 188 green light-emitting element
190 first spectral peak
192 second spectral peak
194 third spectral peak
200 relative luminance efficiency at 80 nm bandwidth
202 relative luminance efficiency at 55 nm bandwidth
204 relative luminance efficiency at 30 nm bandwidth

What is claimed is:

1. An electro-luminescent device comprising an array of light-emitting elements, including a near white light-emitting element, wherein the near white light-emitting element includes an inorganic light-emitting layer of quantum dots, spaced between a pair of electrodes, and wherein the light-emitting layer produces a spectrum of light in response to a current supplied from the pair of electrodes, the spectrum of light having at least a bimodal distribution of wavelengths, and wherein each mode is formed from distinct spectral peaks and wherein each distinct spectral peak is separated from each additional distinct spectral peak forming each additional mode by an inter-modal minimum, the spectral radiant power of this inter-modal minimum being less than 5% of the maximum value within the spectral radiant power distribution.

2. The electro-luminescent device of claim 1, wherein the inorganic light-emitting layer of quantum dots produces a spectrum of light having an exact bimodal distribution of wavelengths.

3. The electro-luminescent device of claim 1, wherein the spectrum of light having at least a bi-modal spectral distribution includes a first peak between 410 nm and 490 nm and a second peak between 520 nm and 620 nm.

4. The electro-luminescent device of claim 1, wherein the bi-modal spectral distribution of light is produced by the light-emitting layer of quantum dots, wherein the quantum dots are of at least two substantially distinct sizes.

5. The electro-luminescent device of claim 1, wherein the light-emitting layer is comprised of:
    a) a plurality of light-emitting cores, each core having a semiconductor material that emits light in response to a recombination of holes and electrons, each light-emitting core defining a first bandgap;
    b) a plurality of semiconductor shells formed respectively about the plurality of light-emitting cores to form core/shell quantum dots, each semiconductor shell has a second bandgap wider than the first bandgap; and
    c) an inorganic semiconductor matrix, connected to the semiconductor shells and their corresponding light-emitting cores, providing a conductive path, through the light-emitting layer so as to permit the recombination of holes and electrons within the core/shell quantum dots.

6. The electro-luminescent device of claim 1, wherein the spectrum of light having at least a bi-modal distribution of wavelength has an exact tri-modal distribution of wavelengths.

7. The electro-luminescent device of claim 6, wherein one of the spectral peaks of the tri-modal distribution of wavelengths is within an interval of 550 and 560 nm.

8. The electro-luminescent device of claim 1, wherein the device is a full-color display and the array of light-emitting elements, include at least three additional light-emitting elements for emitting at least three additional colors of light other than white or near white.

9. The full-color display of claim 8, wherein each of the at least three additional light-emitting elements has a light-emitting layer comprised of quantum dots.

10. The full-color display of claim 8, wherein the full-color display has a color gamut whose area is defined by the area enclosed by the chromaticity coordinates of the at least three additional light-emitting elements and wherein the area of the color gamut is at least 100% of the area defined by the chromaticity coordinates for emitters defined according to the NTSC standard.

11. The inorganic electro-luminescent display of claim 8, wherein the quantum dots within each of the at least three additional light emitting elements emits light having a spectral bandwidth of 80 nm or less.

12. The full-color display of claim 8, wherein the luminance efficiency for the near white light-emitting element is higher than the luminance efficiency of at least two of the at least three additional light-emitting elements.

13. The full-color display of claim 8, wherein the radiant efficiency of the near white light-emitting element is substantially equal to the radiant efficiency of each of the three at least three additional light-emitting elements.

14. The full-color display of claim 8, wherein the near white light-emitting element has x and y chromaticity coordinates that are within 0.1 radius of the white point of the display.

15. A method of making a near white light-emitting element comprising the steps of:
    a) forming a first size of quantum dots corresponding to a first selected peak wavelength;
    b) forming a second size distribution of quantum dots corresponding to a second selected peak wavelength;
    c) forming additional conductive inorganic particles to promote the flow of holes and electrons to the quantum dots;
    d) forming a mixture of the first size of quantum dots, second size of quantum dots, and the additional conductive inorganic particles according to a predetermined ratio that will produce light at or near a desired white color, wherein the mixture forms a semiconductor matrix; and
    e) providing a first electrode over a substrate, depositing the mixture in operation with the first electrode, and then providing a second electrode in operation with the deposited mixture to form a near white light-emitting element.

16. A display system, comprising:
    a) a near white light-emitting element, wherein the near white light-emitting element includes an inorganic light-emitting layer of quantum dots, spaced between a pair of electrodes, and wherein the inorganic light-emitting layer produces a spectrum of light in response to a current supplied from the pair of electrodes, the spectrum of light having at least a bimodal distribution of wavelengths, and wherein each mode is formed from distinct spectral peaks and wherein each distinct spectral peak is separated from each additional distinct spectral peak forming each additional mode by an inter-modal minimum, the spectral radiant power of this inter-modal minimum being less than 5% of the maximum value within the spectral radiant power distribution;
    b) at least three additional light-emitting elements that emit at least three additional colors of light other than the near white color of light; and
    c) a controller for driving the light-emitting elements such that the controller employs the first light-emitting element in cooperation with the at least three additional light-emitting elements.

* * * * *